(12) United States Patent
Romero et al.

(10) Patent No.: US 6,256,549 B1
(45) Date of Patent: Jul. 3, 2001

(54) INTEGRATED MANUFACTURING SOLUTIONS

(75) Inventors: Bernadette P. Romero, Santa Clara; Carl H. Fong, Cupertino, both of CA (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/078,017

(22) Filed: May 13, 1998

(51) Int. Cl.⁷ .................................................. G06F 19/00
(52) U.S. Cl. .......................... 700/121; 700/95; 700/96; 700/107; 700/115; 700/117; 29/622; 29/630; 29/842; 29/856; 438/25; 438/51; 438/55; 438/67
(58) Field of Search ................................ 700/95, 96, 99, 700/102, 107, 112, 115, 117, 121, 1, 2, 3, 4, 5, 20; 29/622.23, 830–832, 842, 854; 438/15, 25, 51, 55, 67

(56) References Cited

U.S. PATENT DOCUMENTS

| | | | |
|---|---|---|---|
| 4,807,108 | * | 2/1989 | Ben-Arieh et al. ..................... 700/28 |
| 4,827,423 | * | 5/1989 | Beasley et al. ......................... 700/96 |
| 4,864,514 | | 9/1989 | Yamanaka et al. .................... 364/489 |
| 5,105,362 | * | 4/1992 | Kotani ................................... 700/121 |
| 5,241,465 | * | 8/1993 | Oba et al. ............................. 700/100 |
| 5,249,120 | * | 9/1993 | Foley .................................... 700/100 |
| 5,291,397 | * | 3/1994 | Powell .................................. 700/100 |
| 5,465,217 | | 11/1995 | Yip et al. .............................. 364/489 |
| 5,498,767 | | 3/1996 | Huddleston et al. ..................... 437/8 |
| 5,608,638 | | 3/1997 | Tain et al. ........................ 364/468.28 |
| 5,625,816 | | 4/1997 | Burdick et al. ....................... 395/614 |
| 5,661,669 | | 8/1997 | Mozumder et al. .................. 364/552 |
| 5,835,898 | * | 11/1998 | Brog et al. ........................... 705/364 |
| 5,862,054 | * | 1/1999 | Li ......................................... 700/108 |

* cited by examiner

Primary Examiner—William Grant
Assistant Examiner—Ramesh Patel
(74) Attorney, Agent, or Firm—Robert P. Bell; Steven Lin

(57) ABSTRACT

The present invention provides a computerized database comprising a first table representing a list of part numbers. The database provides computerized links between individual part numbers and associated manufacturing process data for different process steps for that part number. Rather than correlate data by hand, a user may click on a process step for a particular part number to instantly and accurately retrieve that data. Manufacturing process data may include, for example, backgrind process data, wire binding data, either in numerical or graphical form, testing parameters, packaging data, and labeling data. The database system of the present invention may be used to automatically program various process equipment in an assembly facility with appropriate process data to automatically process finished semiconductor wafers into packaged semiconductor circuits.

16 Claims, 5 Drawing Sheets

INTEGRATED MANUFACTURING SOLUTIONS

FIELD OF THE INVENTION

The present invention relates to the field of manufacturing automation. In the preferred embodiment, the present invention may be applied to integrated circuit manufacturing, in particular, the assembly and packaging of integrated circuits.

BACKGROUND OF THE INVENTION

Integrated circuits are manufactured in a number of discreet steps using a variety of processes and equipment. Due to the differences in these processes and economic factors, different processes may be carried out at different locations throughout the globe.

Semiconductor material may be initially grown in a single crystal in a melt process which typically may be performed in a specialized facility, usually by a dedicated vendor for such processes. Single crystals are then sliced into wafers which may then be further processed in a "FAB" or fabrication facility. In the Fab, the actual circuits may be formed on the semiconductor wafer using a variety of known semiconductor processing processes.

Once each wafer has been formed into circuits, it may then be sent to a facility for final machining, testing, sawing into individual circuits, and packaging. For example, the wafer may first be ground to a desired thickness using a "backgrind" process. Such grinding reduces the thickness of the semiconductor circuit to a desired design size. The wafer may then be sawed or broken into a number of individual chips or circuits. Each chip may then be mounted in a frame or carrier with electrical leads wired-bonded from the carrier to the chip at discrete pad locations.

Finally, the semiconductor chip may be packaged (encapsulated) and labeled to form a final product. During this assembly process, the circuit may be tested at a number of stages to insure that the circuit is functioning properly.

It is with this final assembly process that the present invention is concerned. Various other processes in semiconductor circuit manufacturing are highly automated. For example, the design of an actual circuit, including the various layers, may be sent to a Fab in the form of magnetic tape. Such a tape may be used with computer aided manufacturing equipment to perform the various circuit manufacturing steps on a semiconductor wafer.

However, the final assembly process has remained a largely manually programmable process to date. FIG. 1 is a block diagram illustrating the relationship between data elements used in assembling a semiconductor device 180. When data is transmitted to a semiconductor assembly facility (which may typically be located overseas), such data may be transmitted manually in the form of paper documents. Discrete data representing backgrind thickness 125, wire bonding pattern 135, chip size and packaging 145, and identification marking 165, may be provided in discrete separate documents. Each of these documents may be listed in table for a particular part model number comprising an assembly release code specification 115.

When assembling a particular semiconductor device, local Engineers may enter data for a particular part (and revision) number, retrieving data from the various documents 115, 125, 135, 145, and 165 provided by the product designer.

Unfortunately, as semiconductor part numbers may be confusingly similar (or may go through several revisions, Rev. A, Rev. B, and the like) the data for each step in the assembly process may become confused by the end user with disastrous results. An improperly ground part, or a part improperly wire bonded may not function properly. Moreover, a mis-marked part, although functional, may be as worthless as a defective part, as the end user will not be able to discern the correct part number for that part, and thus the intended functionality.

Moreover, even if such data is properly received and correlated, it remains a requirement for the assembly operation to manually program each machine in the process with such data to properly process the semiconductor wafers into assembled chips.

Thus, it remains a requirement in the art to provide a method for transmitting disparate assembly data for a semiconductor device to an assembly operation such that assembly data for different discrete steps is received in a coherent and comprehensive fashion.

Moreover, it remains a requirement in the art to provide a method for programming assembly equipment with assembly data for a semiconductor part such that assembly and packaging of such a part may be automated.

SUMMARY OF THE INVENTION

The present invention provides a computerized database comprising a first table representing a list of part numbers. The database provides computerized links between individual part numbers and associated manufacturing process data for different process steps for that part number.

Rather than correlate data by hand, a user may click on a process step for a particular part number to instantly and accurately retrieve that data. Manufacturing process data may include, for example, backgrind process data, wire binding data, either in numerical or graphical form, testing parameters, packaging data, and labeling data.

The database system of the present invention may be used to automatically program various process equipment in an assembly facility with appropriate process data to automatically process finished semiconductor wafers into packaged semiconductor circuits.

BRIEF DESCRIPTIONS OF THE DRAWINGS

DETAILED DESCRIPTION OF THE INVENTION

The present invention will be described in connection with integrated circuit manufacturing techniques, as such an embodiment is contemplated by the inventors as comprising the best mode of enablement and the preferred embodiment. However, the present invention may also be applied to other types of manufacturing processes without departing from the spirit and scope of the present invention.

Figure 3:
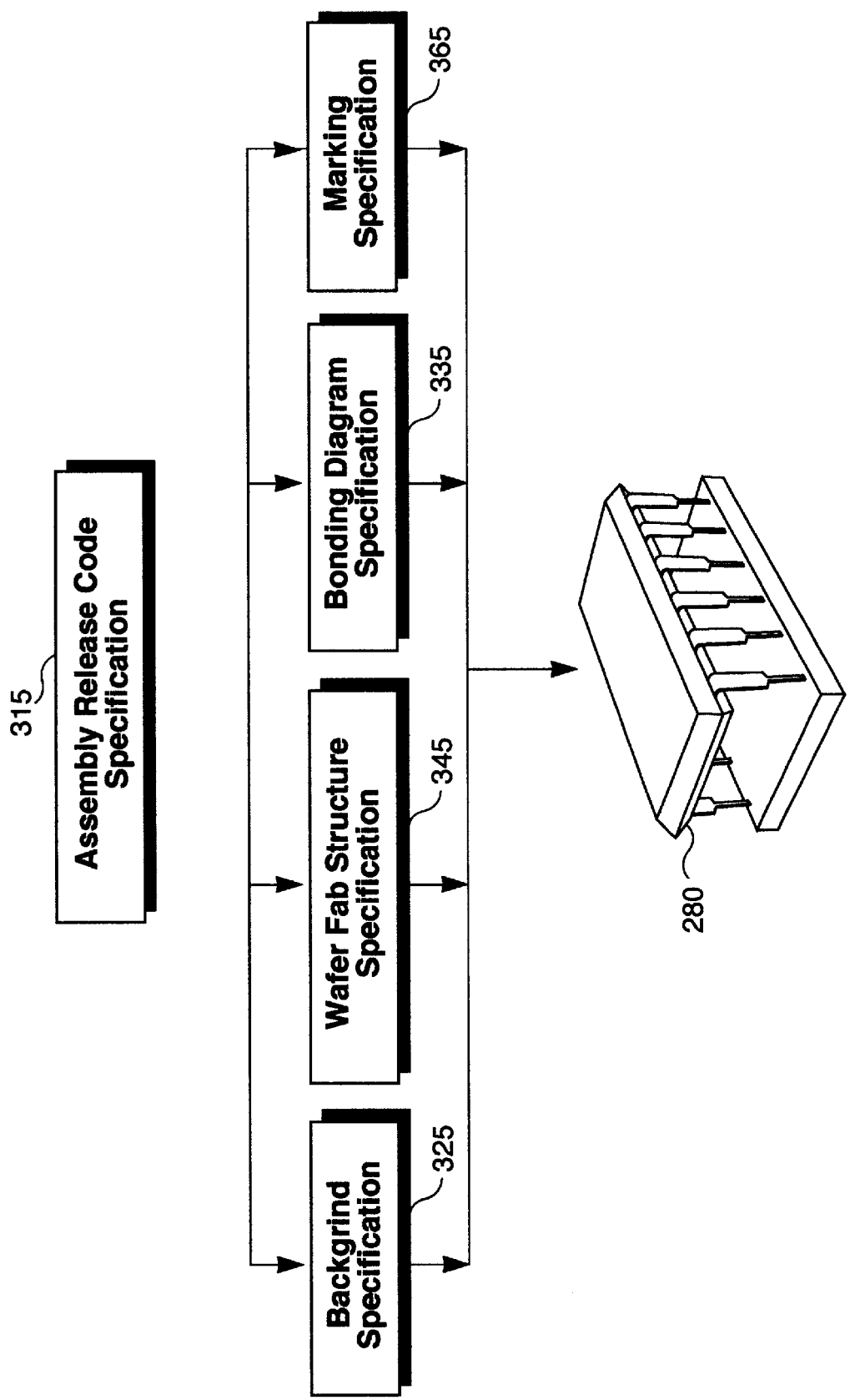
FIG. 3 is a block diagram illustrating how the assembly data in the present invention is packaged for a particular part and revision number.

FIG. 3 is a block diagram illustrating how the assembly data in the present invention is packaged for a particular part and revision number. Rather than provide each data element as a separate paper documents, in the present invention, each data element is provided in computerized form, as an element of a computer database linked to a common assembly release code specification.

Assembly release code specification 315 may be provided in the form of a computer database (e.g., Excel, Paradox, DBase, Oracle, or the like). Assembly release code specification may comprise a number of elements in table form. Such elements may comprise, for example, assembly code, product name, change data, fab process and metal layers, fab code, marking identification, package code, pad size, bonding drawing/revision, and marking specification.

Assembly code may comprise an overall assembly code number identifying a particular model of semiconductor product in a particular packaging format and/or revision. Assembly code serves as the overall identifier for a particular product to be assembled.

Moreover, such an assembly release code specification may comprise specification elements for more than one product. For example, a group of products, or even a manufacturer's entire line of products, may be incorporated into different entries within assembly release code specification 315.

Product name may comprise the informal product name used in-house or for marketing purposes. Oftentimes semiconductor devices are given names (e.g., Pentium™) to more readily distinguish the device from others and provide a name which is easier to remember than a long alphanumeric string. One product name may encompass a number of different models and revisions, and thus a multitude of assembly codes.

Change date may represent the last date specifications for a semiconductor device were last changed. Change date is essential information when communicating with a remotely located assembly facility, as the assembly engineer must be able to readily verify that the data used is indeed correct and up to date. As discussed in the Background of the specification, one problem with the prior art manual techniques is that an assembly engineer may readily mix and match data from different change dates resulting in erroneous assembly.

Fab process and metal layers data may reference data tapes for different fabrication and metalization processes. Such fab data may indicate the resulting overall thickness of a wafer or wafers after processing has been completed. Such data may also be of use in troubleshooting a particular batch or group of devices. Similarly, Fab code provides information as to which Fab performed these fabrication and metalization processes on a group of chips within an assembly code group.

Marking identification refers to the part number to be marked on to the chip. In the assembly release code specification, this data may comprise the chip identifying number (e.g., CL-GD5434-QC-AJ). However, actual marking artwork (with company logo, font, and the like) may be provided separately as the marking specification. In the prior art, the assembly engineer would have to manually match up such artwork with the identification information provided in the assembly release code specification. As discussed below, in the present invention, this process is automated.

Package size information refers to the size and type of package used to hold individual semiconductor devices. Many such package types are in use, from the now little used dual in-line packages (DIPs) to the more prevalent surface mount and socket devices. In addition to package type, size must also be specified (e.g., 12.5×12.5 mm, 10.2×10.1 mm, and the like).

Bonding drawing/revision data is essential in properly programming a bonding machine. In the prior art, such machines may be programmed using a "learning" mode. A skilled worker would manually operate such a machine to bond a device according to a given bonding drawing. Once the bonding pattern is "learned" the bonding machine may then operate automatically. As noted above, in the prior art, if the wrong bonding pattern were to be used, the resultant device might not work. Due to the large numbers of part numbers and revisions, an assembly engineer might easily use the wrong drawing to program a bonding machine. Moreover, programming such a machine manually is a time consuming and error prone task.

Referring to FIG. 3, assembly release code specification 315 may contain links to individual specification elements 325, 345, 335, and 365. Thus, for example, a user, using a database program with a graphical user interface (GUI) may click on an individual element within the assembly release code to retrieve corresponding data. Such links may be formed in an Excel database using a macro written using VisualBasic or the like.

For example, by clicking on fab process, the backgrind specification may be linked from the database, providing accurate and up-to-date information as to the correct grinding thickness for a particular group or batch of wafers.

Similarly, wafer fab structure specification 345 may be brought up by clicking on package code information within assembly release code specification. Wafer fab structure specification 345 may contain data regarding composition and deposition thickness of metallizations, dielectrics, and substructures (i.e., active and passive), the size of the frame to be used for packaging the device, as well as encapsulation data.

Bonding diagram 335 may be brought up by clicking on bonding drawing/revision within assembly release code specification 315. Bonding diagram 335 may comprise, for example, an actual bonding diagram in a scanned-in or CAD format. Alternatively, bonding diagram 335 may include specific programming instructions for programming a wire bonding machine.

Figure 5:
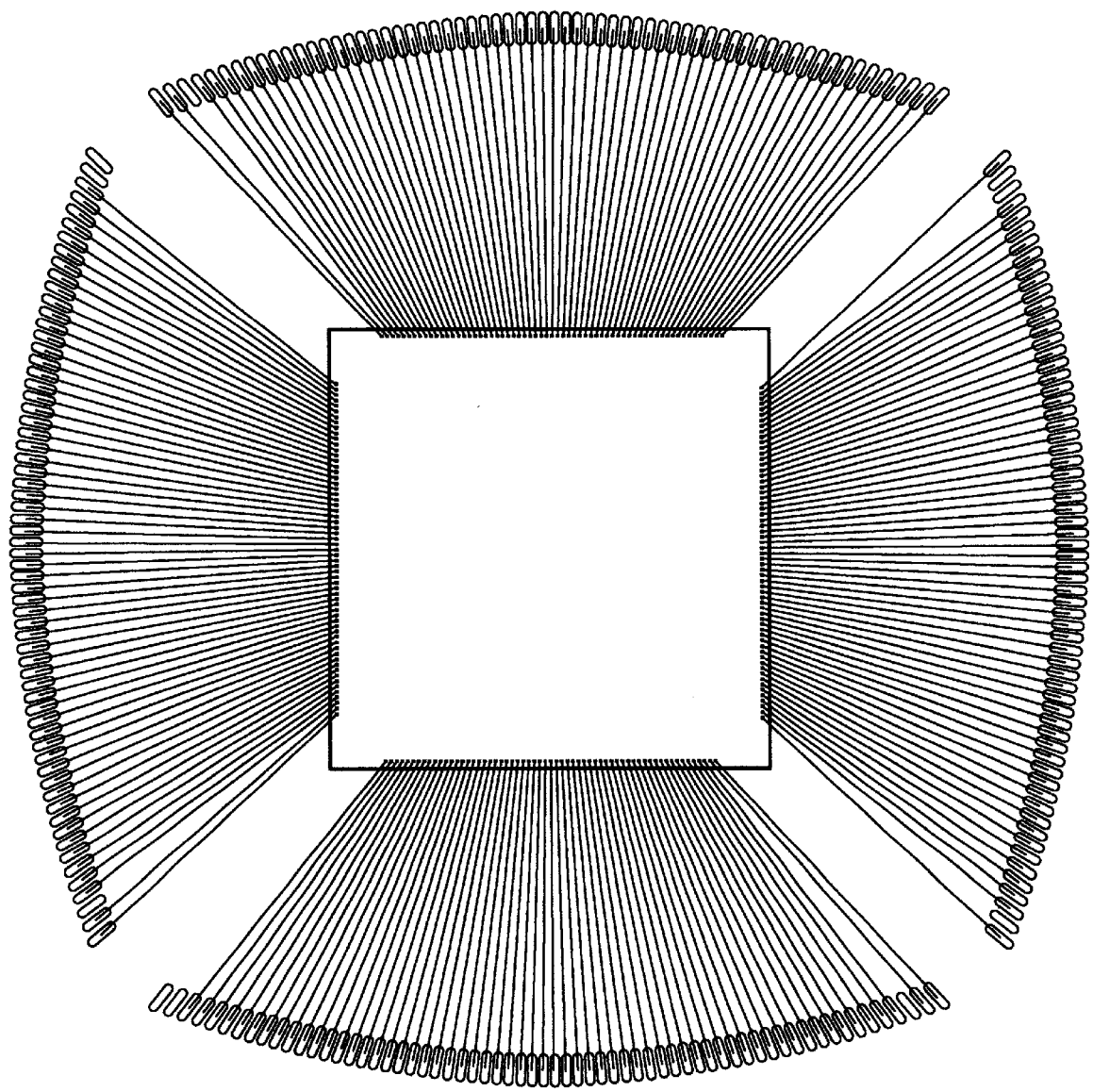
FIG. 5 is a an example of a bonding diagram for a semiconductor device.

FIG. 5 is a an example of a bonding diagram for a semiconductor device. The semiconductor chip is illustrated in the central portion of the Figure, with bonding wires radiating outwardly to pads on a chip carrier. A bonding diagram such as illustrated in FIG. 5 is necessary, as it illustrates connectivity between pads on the chip and pads on the carrier. Note that not all pads are used, and that some pads on the chip carrier are bonded to the same pad on the chip or vice versa.

In addition, such a diagram illustrate where on the chip and carrier pads are located. Pads may be asymmetrically located due to design constraints, and actual pad location is thus required for correct bonding.

Marking specification 365 may be brought up by clicking on the marking identification field of marking specification field within assembly release code specification 315. Marking specification 365 may comprise actual artwork, in graphical form, for use in marking a completed semiconductor device and include soft code for direct download to marking plate makers, eliminating the scan of keyboard text entry.

Figure 4:
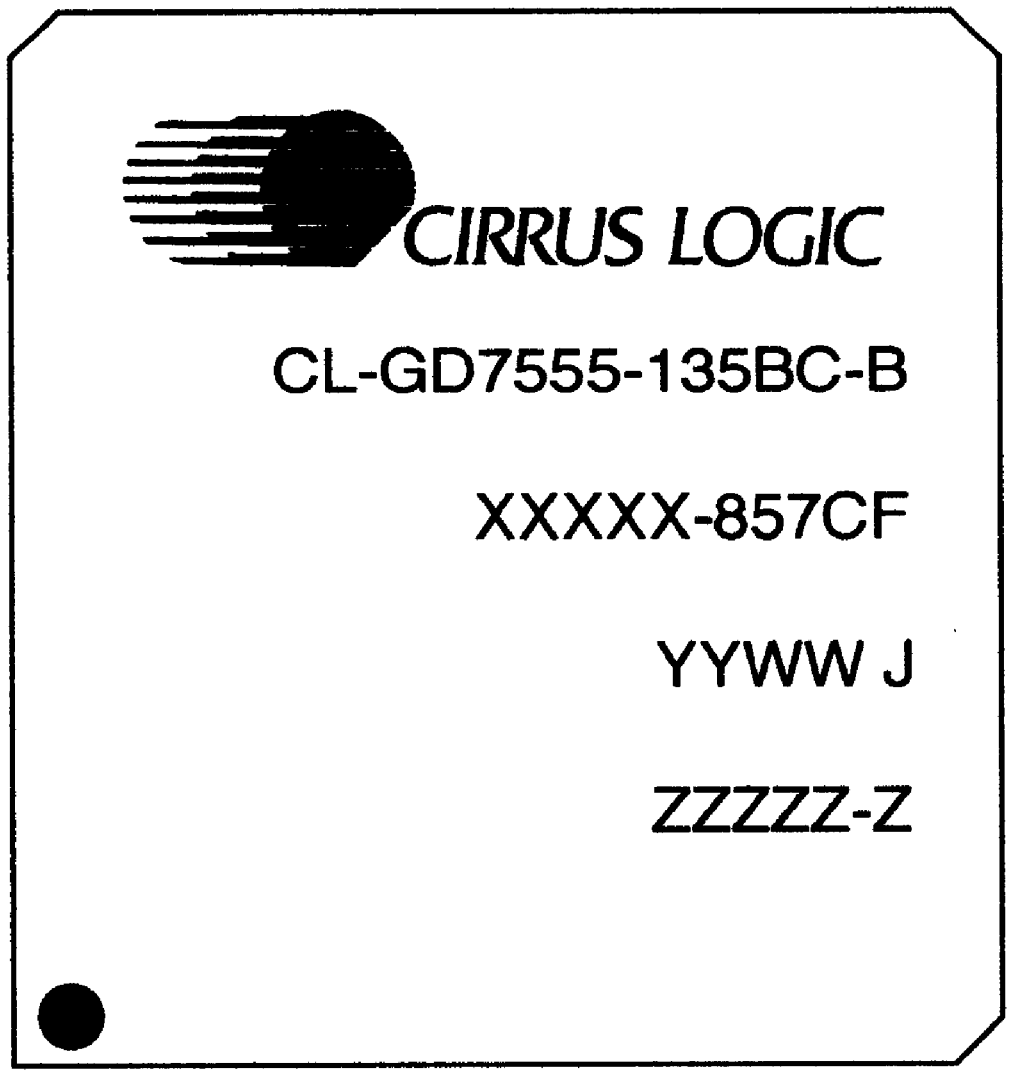
FIG. 4 is a diagram illustrating an example of marking specification artwork for a semiconductor device.

FIG. 4 is a diagram illustrating an example of marking specification artwork for a semiconductor device. In addition to product identification number (e.g., CLGD7555-135BC-B) additional information may be provided. For example, field YYWW may indicate year and work week that a device is assembled. Field XXXXX may comprise a lot code representing a group of wafers or chips. Field ZZZZZZ may indicate country of origin and assembly code. In addition a dot, illustrated in the lower left hand corner, may indicate the location of pin 1 on the device. Finally, the manufacturer name and trademark may be provided ont he device to mark the source of the goods.

As illustrated in FIG. 3, such data is conveniently packaged in a relational database for easy retrieval by an assembly engineer. The assembly engineer need not keep large volumes of paper files and attempt to match paper documents to individual release codes. Some elements for different device lots may remain the same, (e.g., binding, packaging, or the like), and thus the database of the present invention may link to those common elements without having to store multiple copies of the same specification element on computer.

The invention of FIG. 3 also allows such data to be transmitted electronically, either vi a magnetic media (e.g., tape) or by network. Assembly information may be updated almost instantaneously without having to wait for paper documents to be mailed or faxed. Moreover, errors induced from poor copies of paper documents and the like may be reduced or eliminated.

Figure 1:
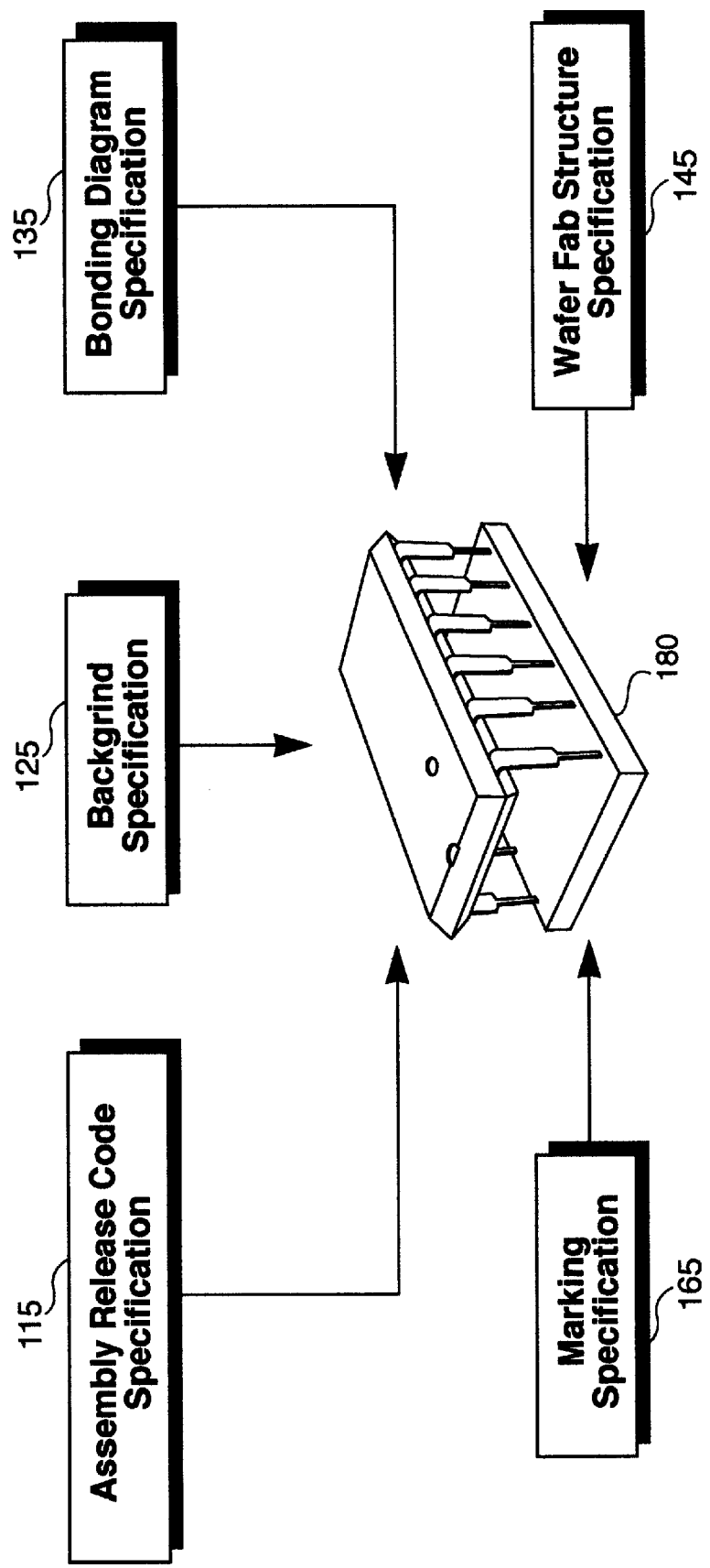
FIG. 1 is a block diagram illustrating the relationship between data elements used in assembling a semiconductor device 180.
Figure 2:
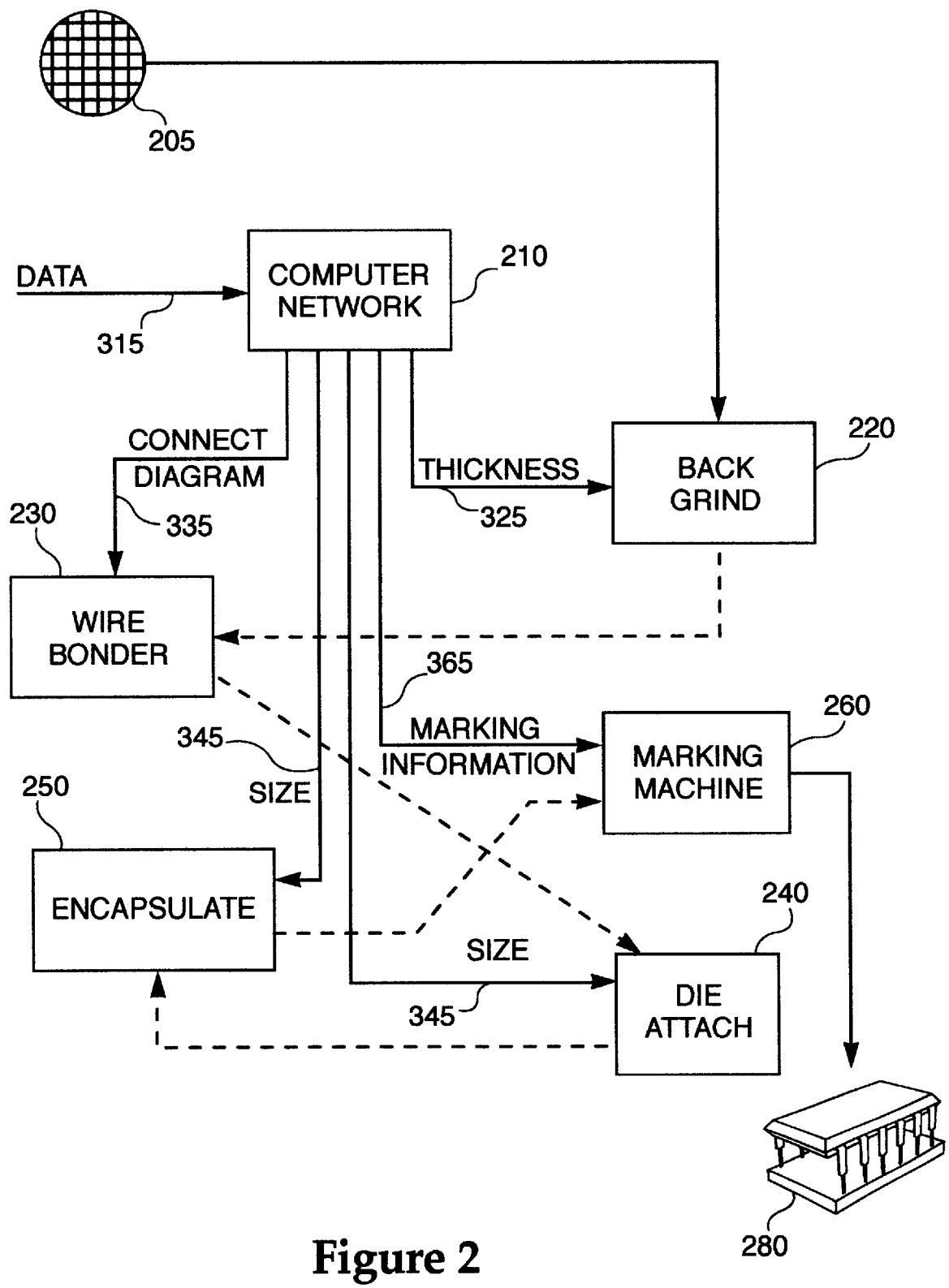
FIG. 2 is a block diagram illustrating the various machine elements in the assembly process and the relationship of the various data elements to each machine element.

FIG. 2 is a block diagram illustrating the various machine elements in the assembly process and the relationship of the various data elements to each machine element. Assembly release code specification 315 may be loaded into computer network 210 which may comprise, for example, a computer network within an assembly facility. computer network 210 may also comprise a company-wide network linking design and assembly operations.

Fabricated semiconductor wafers 205 may be processed in a number of assembly steps to form individual semiconductor devices 280. For the purposes of illustration, not all assembly and testing steps are illustrated in FIG. 2 In block 220, a grinding machine may be used to perform the backgrind operation to reduce the thickness of wafers 205 according to backgrind specification 325 retrieved from computer network 210.

Backgrind specification data 325 may be loaded into grinding machine 220 automatically using a computer integrated manufacturing (CIM) network or the like, or may be manually entered from a network workstation, by loading a disk containing data downloaded from computer network 210, or by other manual means. In the preferred embodiment, full automation of data handling is preferred in order to reduce the instance of human error.

ground wafers may then be sawed or broken into individual chips which are then wire bonded to a chip carrier frame in wire bonder 230. Bonding diagram specification 335 may be downloaded from computer network 210 into wire bonder 230. If wire bonder 230 is not capable of accepting such data, the correct bonding diagram may be retrieved from computer network 210 using a factory floor workstation.

One advantage of the database of the present invention is that it may be implemented within assembly facilities having different levels of automation. Thus, for older assembly equipment not capable of accepting automated data, data may be manually (but more accurately than the prior art) entered. As new assembly equipment comes on-line, it may be interfaced directly with the database of the present invention to eliminate such manual data entry steps.

Once bounded to a carrier frame, individual chips may then be attached to a die in block 240 using package data 345. The dies may then be encapsulated in block 250, again using package information 345. Packaged semiconductors may then be marked by marking machine 260 using marking artwork 365 downloaded from computer network 210. The resultant semiconductor device 280 has thus been assembled with a high level of reliability.

Various testing stages are not illustrated in FIG. 2. For example, individual chips may be tested on the wafer 205 at incoming inspection, after backgrind, and after sawing. Wire bonds may be similarly tested after wire bonding, and the entire package tested after die attach and encapsulation. Testing specification data may also be incorporated into assembly release code specification 315 and sent to appropriate testing machinery in a similar manner as the assembly data is sent to assembly machines in FIG. 2.

By providing all elements of assembly data tied together into a common database, the present invention reduces or eliminates the instance of errors which may occur when such data is transmitted in manual form. Moreover, if the database of the present invention is tied to a computer aided manufacturing facility, such data may be automatically loaded or transferred to assembly equipment during the assembly processes.

While the preferred embodiment and various alternative embodiments of the invention have been disclosed and described in detail herein, it may be apparent to those skilled in the art that various changes in form and detail may be made therein without departing from the spirit and scope thereof.

For example, as noted above, the application of the present invention to integrated circuit manufacturing technology is by way of example only, and not intended to limit the scope of the present invention in any way. The present invention may be equally applied to other types of manufacturing by substituting appropriate manufacturing data for the integrated circuit manufacturing data discussed herein.

What is claimed is:

1. A method of assembling a semiconductor device, comprising the steps of:

generating a database comprising a table of assembly specification data for the semiconductor device;

generating data files representing data elements corresponding to elements in the table of assembly specification data;

linking the data files to corresponding data elements in the table of assembly specification data;

transmitting the database and linked data files to an assembly facility; and selectively retrieving data files from the database to retrieve data for individual assembly steps, wherein said step of generating a database comprises the step of:

generating a database of assembly specification data references for a semiconductor device including marking reference, backgrind reference, bonding diagram reference, and wafer fab structure reference.

2. The method of claim 1, wherein said step of generating data files representing data elements corresponding to elements in the table of assembly specification data comprises the steps of:

generating a marking specification data file;

generating a backgrind specification data file;

generating a bonding diagram specification file; and generating a wafer fab structure specification file.

3. The method of claim 2, wherein said step of linking the data files to corresponding data elements in the table of assembly specification data comprises the steps of:
- linking the marking specification data file to the marking reference of the database;
- linking the backgrind specification data file to the backgrind reference of the database;
- linking the bonding diagram specification file to the bonding diagram reference of the database; and
- linking the wafer fab structure specification file to the wafer fab structure reference of the database.

4. The method of claim 3, wherein said step of transmitting the database and linked data files to an assembly facility comprises the step of:
- transmitting the database and linked data files via magnetic media to the assembly facility.

5. The method of claim 4, wherein said step of selectively retrieving data files from the database to retrieve data for individual assembly steps comprises the step of:
- manually retrieving files from the database to retrieve data for individual assembly steps.

6. The method of claim 3, wherein said step of transmitting the database transmitting the database and linked data files to an assembly facility comprises the step of:
- transmitting the database and linked data files via computer network to the assembly facility.

7. The method of claim 6, wherein said step of selectively retrieving data files from the database to retrieve data for individual assembly steps comprises the step of:
- loading at least a portion of selected files comprising assembly specification data through a local network to an assembly machine as an individual assembly step.

8. The method of claim 7, wherein said step of selectively retrieving data files from the database to retrieve data for individual assembly steps comprises the steps of:
- loading the marking specification data file through a local network to a marking machine to program the marking machine to mark a semiconductor device according to the marking specification via independent mark plate generation or advance marking equipment.

9. The method of claim 7, wherein said step of selectively retrieving data files from the database to retrieve data for individual assembly steps comprises the steps of:
- loading the backgrind specification data file through a local network to a semiconductor grinding machine to program the semiconductor grinding machine to grind a semiconductor wafer to the backgrind specification.

10. The method of claim 7, wherein said step of selectively retrieving data files from the database to retrieve data for individual assembly steps comprises the steps of:
- loading the bonding diagram specification data file through a local network to a wire bonding machine to program the wire bonding machine to wire bond a semiconductor device according to the bonding diagram specification.

11. The method of claim 7, wherein said step of selectively retrieving data files from the database to retrieve data for individual assembly steps comprises the steps of:
- loading the wafer fab structure specification data file through a local network to a die attachment machine to program the die attachment machine to attach a die to the semiconductor device according to the wafer tab structure specification.

12. The method of claim 7, wherein said step of selectively retrieving data files from the database to retrieve data for individual assembly steps comprises the steps of:
- loading the wafer fab structure specification data file through a local network to a encapsulation machine to program the encapsulation machine to encapsulate a semiconductor device according to the wafer fab structure specification.

13. An automated method of assembling a semiconductor device, comprising the steps of:
- generating a database comprising a table of assembly data references for a semiconductor device including marking reference, backgrind reference, bonding diagram reference, and wafer fab structure reference linked to a plurality of data files representing corresponding data elements;
- transmitting the database and linked data files to an assembly facility; and
- loading the data files to corresponding assembly machines to program corresponding assembly machines to assemble a semiconductor device according to the data references.

14. The method of claim 13, wherein said loading step further comprises the steps of:
- loading the marking specification data file through a local network to a marking machine to program the marking machine to mark a semiconductor device according to the marking specification;
- loading the backgrind specification data file through a local network to a semiconductor grinding machine to program the semiconductor grinding machine to grind a semiconductor wafer to the backgrind specification;
- loading the bonding diagram specification data file through a local network to a wire bonding machine to program the wire bonding machine to wire bond a semiconductor device according to the bonding diagram specification;
- loading the wafer fab structure specification data file through a local network to a die attachment machine to program the die attachment machine to attach a die to the semiconductor device according to the wafer fab structure specification; and
- loading the wafer fab structure specification data file through a local network to a encapsulation machine to program the encapsulation machine to encapsulate a semiconductor device according to the wafer fab structure specification.

15. A computer memory storing instructions for programming a plurality of computer-controlled semiconductor assembly machines, the computer memory comprising:
- a first memory portion comprising a table of assembly specification data references for a semiconductor device; and
- second memory portions including a plurality of data references corresponding to entries in the table of the first memory portion, each of said plurality of data references comprising a specification for an assembly operation of a semiconductor device;
- wherein the table of the first memory portion is linked to corresponding second memory portions such that a user examining the table of the first memory portion may link to a corresponding second memory portion,
- wherein said table of assembly specification data references in said first memory portion includes a marking reference, backgrind reference, bonding diagram reference, and wafer fab structure reference, each linked to a corresponding second memory portion representing corresponding data elements.

16. The computer memory of claim 15, wherein said plurality of data references in second memory portions comprise:

a marking specification data file for programming a marking machine to mark a semiconductor device according to a marking specification;

a backgrind specification data file for programming a semiconductor grinding machine to grind a semiconductor wafer to a backgrind specification;

a bonding diagram specification data file for programming a wire bonding machine to wire bond a semiconductor device according to a bonding diagram specification; and a wafer fab structure specification data file for programming the die attachment machine to attach a die to the semiconductor device according to the wafer fab structure specification and for programming an a encapsulation machine to encapsulate a semiconductor device according to the wafer fab structure specification.

* * * * *